United States Patent
Melli et al.

(10) Patent No.: US 11,695,266 B2
(45) Date of Patent: Jul. 4, 2023

(54) PERFORMANCE THREE-PHASE GROUND FAULT CIRCUIT INTERRUPTER

(71) Applicant: Littelfuse, Inc., Chicago, IL (US)

(72) Inventors: S. Ali Melli, Saskatoon (CA); Loc Gia Luu, Saskatoon (CA)

(73) Assignee: Littelfuse, Inc., Chicago, IL (US)

( * ) Notice: Subject to any disclaimer, the term of this patent is extended or adjusted under 35 U.S.C. 154(b) by 114 days.

(21) Appl. No.: 17/363,716

(22) Filed: Jun. 30, 2021

(65) Prior Publication Data

US 2023/0006435 A1    Jan. 5, 2023

(51) Int. Cl.
*H02H 3/16* (2006.01)
*H02H 1/00* (2006.01)

(52) U.S. Cl.
CPC .......... *H02H 3/165* (2013.01); *H02H 1/0007* (2013.01)

(58) Field of Classification Search
CPC .... G01R 19/02; G01R 19/165; G01R 23/165; G01R 31/50; G01R 31/52; H01H 83/02; H02H 1/0007; H02H 3/00; H02H 3/14; H02H 3/16; H02H 3/165; H02H 3/33; H02H 3/40; H02H 3/52; H04B 2201/70727; H04B 2203/5466; H04L 27/2628; H04L 27/265; H04L 27/2634; H04L 27/2651; H04L 27/26524; H04L 27/26025; H03M 1/1085

See application file for complete search history.

(56) References Cited

U.S. PATENT DOCUMENTS

| | | | |
|---|---|---|---|
| 8,995,098 B2 * | 3/2015 | Tomimbang ......... | H02H 11/002 361/115 |
| 10,790,659 B1 * | 9/2020 | Lee ..................... | H02H 3/165 |
| 2007/0081281 A1 * | 4/2007 | Hamer ................ | H02H 3/165 361/42 |

(Continued)

FOREIGN PATENT DOCUMENTS

| | | |
|---|---|---|
| EP | 1675147 B1 | 8/2007 |
| EP | 2747116 B1 | 6/2016 |

(Continued)

OTHER PUBLICATIONS

European Search Report and Written Opinion for the European Patent Application No. EP22180231, dated Nov. 29, 2022, 8 pages.

*Primary Examiner* — Jared Fureman
*Assistant Examiner* — Nicolas Bellido
(74) *Attorney, Agent, or Firm* — KDW Firm PLLC

(57) ABSTRACT

Devices herein may include conductor lines connected between a power supply and load, each of the conductor lines coupled to an AC contactor and a contactor control circuit, wherein the contactor control circuit is operable to open and close one or more contactors of the AC contactor. The devices may further include a current transformer coupled to the conductor lines, the current transformer operable to output a secondary current corresponding to a primary current magnitude of an electrical current not flowing to the load, wherein the AC contactor is connected between the power supply and the load. Devices may further include a zero cross detection circuit operable to generate an interrupt at each of a plurality of zero crossings for a microprocessor, and determine whether to open the one or more contactors of the AC contactor in a predetermined optimum interval calculated with respect to the zero crossing points.

18 Claims, 15 Drawing Sheets

(56) References Cited

U.S. PATENT DOCUMENTS

2011/0216452 A1\* 9/2011 Haines .................... H02H 3/00
                                                                361/42
2013/0188290 A1   7/2013 Tomimbang
2014/0168830 A1\* 6/2014 Vangool ................ H02H 3/338
                                                                361/47
2017/0324195 A1\* 11/2017 Eriksen ................. H01R 24/78

FOREIGN PATENT DOCUMENTS

GB            2275541 A    8/1994
WO    WO-2015118163 A1 \*  8/2015  ........... G01R 31/086

\* cited by examiner

PERFORMANCE THREE-PHASE GROUND FAULT CIRCUIT INTERRUPTER

FIELD OF THE DISCLOSURE

The disclosure relates generally to the field of circuit protection devices, and more particularly to ground-fault circuit-interrupter devices.

BACKGROUND OF THE DISCLOSURE

Ground-fault circuit-interrupter (GFCI) devices are switches that open when current in an electric circuit is flowing along an unintended path. In general, a GFCI device detects when current flowing from the positive side of the power source (e.g., an AC voltage source, or the like) is different than the current returning to the negative side of the power source. GFCIs are often used in locations where electric current might find an alternative path to return to ground (e.g., near water, grounded metal structures, or the like). GFCI devices may be used to shut off a circuit to prevent unwanted shocks or electrocution due to the current traveling along an unintended path. Accordingly, the installation of GFCI devices in certain locations is often mandated by different safety standards. Additionally, these safety standards often specify what types of devices are suitable to be installed in such locations.

Some standards exist that specify minimum requirements for the function, construction, performance, and markings of GFCI devices. For example, Underwriter's Laboratories (UL) 943C standard is used for class C and D GFCI devices, while UL943 standard is used for Class A GFCI devices. UL 943C specifies that a GFCI device must satisfy at least the following performance requirements: (1) the GFCI must be able to withstand line transients of 6 kV and 3 kA as defined by International Electrotechnical Commission (IEC) 61000-4-5; (2) the GFCI must be able to pass a 2200 Volt AC dielectric test for 60 seconds; (3) the GFCI must have a ground-fault trip level of 20 mA (e.g., for class C and D GFCI; 6 mA for class A GFCI); (4) the GFCI must have a trip time that is less than the inverse time curve defined for GFCI devices and must not exceed 20 ms for high ground-fault currents; (5) the GFCI must be able to withstand a 5 kA short-circuit fault; (6) the GFCI must be able to function from 85% to 110% voltage for a given load, such as 60 A or 100 A, applied over a temperature range of −35° C. to 40° C.; (7) the GFCI must be able to monitor load-side ground continuity (e.g., for class C and D GFCI); and (8) the GFCI must include a ground-fault test function.

It would therefore be desirable to provide a GFCI device that meets or exceeds the minimum requirements set forth in such standards.

SUMMARY

This Summary is provided to introduce a selection of concepts in a simplified form that are further described below in the Detailed Description. This Summary is not intended to necessarily identify key features or essential features of the claimed subject matter, nor is it intended as an aid in determining the scope of the claimed subject matter.

In some embodiments, a device may include a plurality of conductor lines connected between a power supply and a load, each of the plurality of conductor lines coupled to an alternating current (AC) contactor and a contactor control circuit, wherein the contactor control circuit is operable to open and close one or more contactors of the AC contactor. The device may further include a current transformer coupled to the plurality of conductor lines, wherein the current transformer is operable to output a secondary current corresponding to a primary current magnitude of an electrical current not flowing to the load, and wherein the AC contactor is connected between the power supply and the load. The device may further include a zero cross detection circuit operable to generate an interrupt at each of a plurality of zero crossings for a microprocessor, and determine whether to open the one or more contactors of the AC contactor in a predetermined optimum interval calculated with respect to the plurality of zero crossing points.

In some embodiments, a ground fault circuit interrupter connected between a power supply and a load, the ground fault circuit interrupter including an alternating current (AC) contactor and a current transformer each connected to a plurality of conductor lines, wherein the plurality of conductor lines are connected to the power supply and the load. The device may further include a control circuit of the ground fault circuit, the control circuit including a current transformer coupled to the plurality of conductor lines, wherein the current transformer is operable to output a secondary current corresponding to a primary current magnitude of an electrical current not flowing to the load, and wherein the AC contactor is connected between the power supply and the load. The device may further include a zero cross detection circuit operable to generate an interrupt at each of a plurality of zero crossings for a microprocessor, and determine whether to open the one or more contactors of the AC contactor in a predetermined optimum interval calculated with respect to a plurality of zero crossing points.

In some embodiments, a three-phase ground-fault circuit-interrupter (GFCI) device may include a plurality of conductor lines connected between a power supply and a load, each of the plurality of conductor lines coupled to an alternating current (AC) contactor and a contactor control circuit, wherein the contactor control circuit is operable to open and close one or more contactors of the AC contactor. The GFCI device may further include a current transformer coupled to the plurality of conductor lines, wherein the current transformer is operable to output a secondary current corresponding to a primary current magnitude of an electrical current not flowing to the load. The GFCI device may further include a zero cross detection circuit operable to generate an interrupt at each of a plurality of zero crossings for a microprocessor, and determine whether to open the one or more contactors of the AC contactor in a predetermined optimum interval calculated with respect to the plurality of zero crossing points.

BRIEF DESCRIPTION OF THE DRAWINGS

The accompanying drawings illustrate exemplary approaches of the disclosed embodiments so far devised for the practical application of the principles thereof, and wherein.

Figure 1:
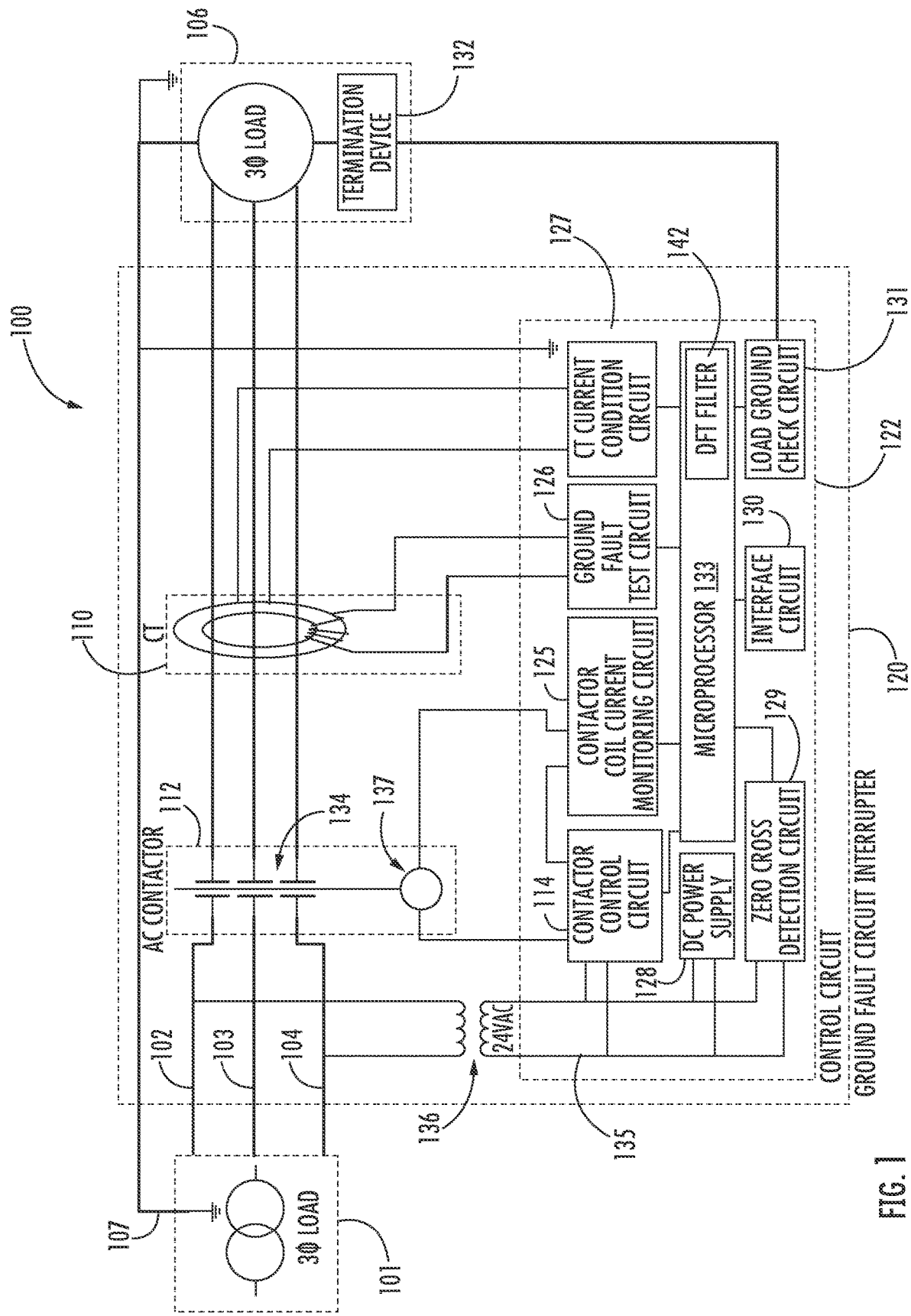
FIG. 1 is a block diagram illustrating an example of a GFCI device in accordance with embodiments of the present disclosure.

The drawings are not necessarily to scale. The drawings are merely representations, not intended to portray specific parameters of the disclosure. The drawings are intended to depict typical embodiments of the disclosure, and therefore should not be considered as limiting in scope. In the drawings, like numbering represents like elements.

Furthermore, certain elements in some of the figures may be omitted, or illustrated not-to-scale, for illustrative clarity. Cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Devices and methods in accordance with the present disclosure will now be described more fully hereinafter with reference to the accompanying drawings, in which embodiments of the system and method are shown. The devices and methods, however, may be embodied in many different forms and should not be construed as being limited to the embodiments set forth herein. Rather, these embodiments are provided so that this disclosure will be thorough and complete, and will fully convey the scope of the system and method to those skilled in the art.

Embodiments of the present disclosure provide an improved protection device (e.g., GFCI) capable of meeting the trip time requirements of UL943(C) while using an AC contactor with inconsistent contact opening time. Unlike prior approaches in which a fast DC contactor with consistent contact opening time is used, the AC contactor of the present embodiments provides reduced average opening times by delaying the trip decision to a known optimum interval calculated respect to a voltage A/C (VAC) line voltage zero cross point. By delaying the disconnect and only tripping the AC contactor in a defined trip zone, the average contactor opening time can be reduced (e.g., by 1 ms).

Furthermore, embodiments of the present disclosure may advantageously provide devices with a low-computational complexity half-wave DFT filter to attenuate odd harmonics.

Still furthermore, embodiments of the present disclosure may advantageously provide detection of a status (e.g., open/closed) of the AC contactor and of AC contactor chatter. Unlike prior approaches in which an auxiliary contact is used, devices herein may include a contactor coil current monitoring circuit and a microprocessor to monitor current of a coil of the AC contactor. The contactor status and chatter may be estimated from the contactor coil current.

Still furthermore, embodiments of the present disclosure may advantageously provide continuous non-destructive auto-monitoring that allows for automatic testing of the ability of the device to respond to a ground fault. Unlike prior approaches in which an artificial fault current is generated at regular intervals (e.g., every hour) to check the health of a current transformer and the CT current condition circuit, devices herein provide a continuous fault current (e.g., 1 mA, 300 Hz), which is generated to check the health of the current transformer and the CT current condition circuit. In some embodiments, the DFT filter attenuates this signal to a level which can be ignored even in a GFCI with a ground-fault trip level of 6 mA, for example. Advantageously, the testing may be done without opening the AC contactor and without compromising the ability of the GFCI to respond to a ground fault.

Referring to FIG. 1, a block diagram of an exemplary three-phase GFCI device (hereinafter "device") 100 in accordance with the present disclosure is illustrated. As will be appreciated, three-phase electric power may be transmitted on three different conductors. In general, each conductor carries an alternating current of the same frequency, where the current on each conductor is delayed from the currents on the other conductors (e.g., by ⅓ and ⅔ of a cycle, respectively). To provide a connection to a three-phase power supply (hereinafter "power supply") 101, the device 100 may include conductor lines 102, 103, and 104, respectively. Each of the conductor lines 102, 103, 104 may include an input terminal connected to the power supply 101 and a load terminal connected to a three-phase load 106 (e.g., a motor or the like). Furthermore, the device 100 may include a ground line 107 and a ground terminal for connecting the device 100 to ground. The device 100 may further include a current transformer (CT) 110, which will be explained in greater detail below.

During operation, current may flow from the power supply 101 to the load 106 through conductor lines 102, 103, 104. The device 100 may be configured to interrupt this flow of current by opening one or more contactors 134 of an AC contactor 112, which is operable with a contactor control (CC) circuit 114, as will be described in greater detail below. In general, the device 100 may be configured to open the AC contactor 112 in a variety of situations and conditions. More specifically, the device 100 may "trip" or open the circuit in response to a fault condition.

To provide the current interrupting features described herein, the device 100 may include a number of sub-devices, circuits, modules and/or other components. For example, the device 100 may include a ground fault circuit interrupter 120 connected to the power supply 101 and the load 106. The ground fault circuit interrupter 120 may include a control circuit 122, which includes a plurality of circuits. As will be described in greater detail below, the control circuit 122 may include the CC circuit 114, a contactor coil current monitoring (CCCM) circuit 125, a ground fault test (GFT) circuit 126, a CT current condition (CTCC) circuit 127, a DC power supply (PS) 128, a zero cross detection (ZXD) circuit 129, an interface circuit 130, and a load ground check (LGC) circuit 131 connected to a termination device 132. Some or all of these circuits may be connected to a microprocessor 133.

It is to be appreciated that the circuits depicted in FIG. 1 may be interconnected (e.g., electrically, physically, operably, or the like) in varying configurations. Not all the connections between circuits are depicted in FIG. 1 for clarity of presentation. However, those of ordinary skill in the art will appreciate the various connections that may be necessary to implement the circuits based on the entirety of this disclosure. For example, although not depicted in FIG. 1, the DC PS 128 may be electrically connected to a number of the other circuits to provide a constant regulated power source thereto. Furthermore, the CC circuit 114 may be electrically and/or operably connected to a number of the other circuits to receive indications (e.g., signals, commands, or the like) from the other circuits that the AC contactor 112 should be opened. In some embodiments, the CC circuit 114 may be configured to receive signals that cause the AC contactor 112 to open or trip, thereby interrupting the current flow between the input terminals and the load terminals of conductor lines 102, 103, and/or 104. Although not shown, the device 100 may include one or more fuses operably connected to the conductor lines 102, 103, 104.

During use, the contactors 134 of the AC contactor 112 may be operable to interrupt current flow through the conductor lines 102, 103, 104. In some embodiments, the AC contactor 112 may be electrically controlled by switching devices including one or more coils 137. Those of ordinary skill in the art will appreciate that a variety of types of contactors may be implemented. Furthermore, the current rating and/or capacity of the AC contactor 112 may vary (e.g., depending upon the implementation, the power source connected to input terminals, the load connected to load terminals, or the like).

In some embodiments, the coils 137 of the AC contactor 112 cause the contactors 134 to open or close when energized. Although non-limiting, contactors 134 may be normally open. As such, when the coils 137 are energized, the contactors 134 close, thereby allowing current to flow from the input terminals to the load terminals. In various embodiments, the coils 137 may be connected in series or in parallel. The coils 137 may be connected to the power supply 101. During use, the CC circuit 114 may be configured to energize and de-energize the coils 137 to open and close the contactors 134.

Although non-limiting, the AC contactor 112 may additionally include heat sinks (not shown) operably connected to the contactors 134. The heat sinks may be attached to poles of the contactors 134. For example, pole terminals that may normally be reserved for additional control-wire connections may be used to mount the heat sinks.

As mentioned above, the CC circuit 114 may be configured to energize and de-energize the coils 137 to open and close the contactors 134. With some examples, the CC circuit 114 may include a low-voltage buffer and a high-voltage solid-state transistor switch (not shown) configured to energize and/or de-energize the coils 137. In some embodiments, an output terminal of the CC circuit 114 may be electrically connected to an input terminal of the AC contactor 112.

In some embodiments, the CC circuit 114 may be configured such that if a transistor switch fails (e.g., shorts, or the like) the contactors 134 will be opened. Additionally, the CC circuit 114 may be configured so a failure of the transistor switch will not damage the low-voltage buffer, potentially causing the contactors 134 to remain closed. Furthermore, the CC circuit 114 may include two transistor switches. In some examples, the transistor switches may be metal-oxide semiconductor field-effect transistors (MOSFETs), bipolar junction transistors, etc. The low-voltage buffers may be connected to the gate of the transistor switches.

Figure 2:
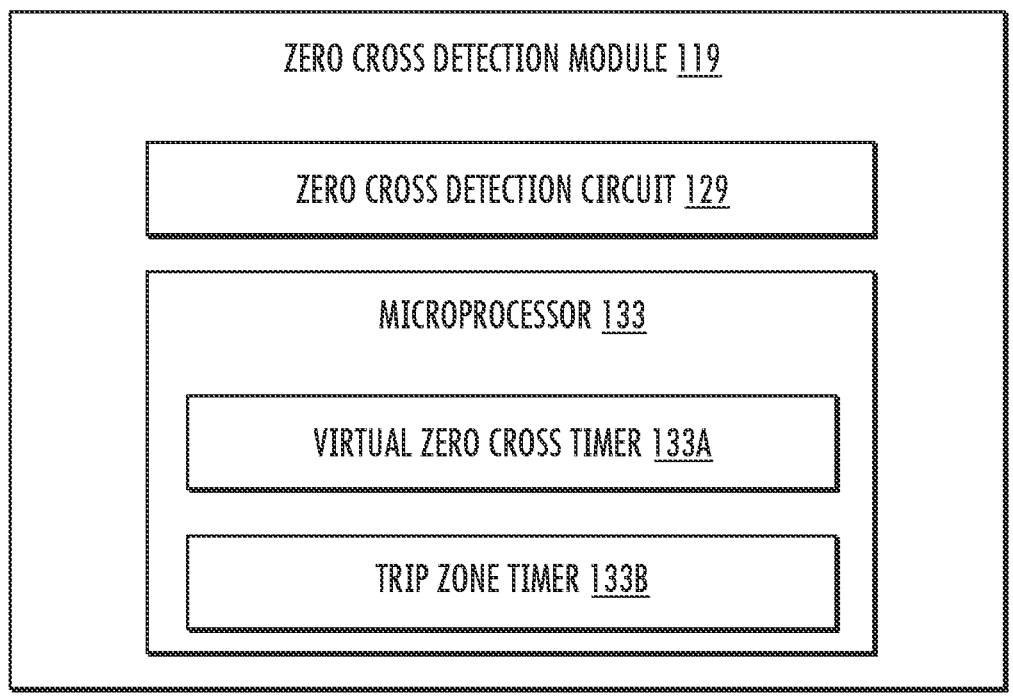
FIG. 2 is a flowchart for defining a trip zone for an AC contactor in accordance with embodiments of the present disclosure.

In some embodiments, an average opening time of the AC contactor 112 is minimized by delaying the trip decision to a known optimum interval calculated with respect to a line voltage zero-cross (ZC) point. As shown in FIG. 2, a ZXD module 119 may include the zero cross detection circuit 129, which is used to generate an interrupt at every zero crossings for the microprocessor 133. The zero cross interrupt may be considered valid (i.e., not triggered by noise) if the time between two consecutive interrupts is in a specific range (e.g., 8.33 ms±0.5 ms for the 60 Hz frequency). Otherwise, it is considered as not detected and a virtual ZC interrupt (e.g., with a period of 8.33 ms for the 60 Hz frequency) is generated by an internal virtual ZC timer 133A to ensure the average opening time is still minimum. If ZC interrupts are missing for more than 2 s, for example, the CC circuit 114 and the microprocessor 133 may output a voltage signal to cause the contactors 134 to open and will indicate a diagnostic error.

In this example, an average opening time of the AC contactor 112 may be minimized by delaying the trip decision to a known optimum interval ("trip zone"). More specifically, the CC circuit 114 is operable to delay disconnection of power to the conductor lines 102, 103, 104 for a predetermined period of time to ultimately decrease an average opening time of the contactors 134. In some embodiments, the predetermined period of time may be determined by performing a test routine, which includes disconnection of the contactors 134, at each 5-degree phase increment of a sine wave voltage of the coil 137 of the AC contactor 112, power at a VAC line 135. As shown, the VAC line 135 may be connected to the ZXD circuit 129, the contactor control circuit 114, the DC PS 128. The test routine may further comprise determining or measuring a time delay to open the contactors 134 of the AC contactor 112 at each 5-degree phase increment. The time delay may be carried out using a trip zone timer 133B.

Figure 3A:
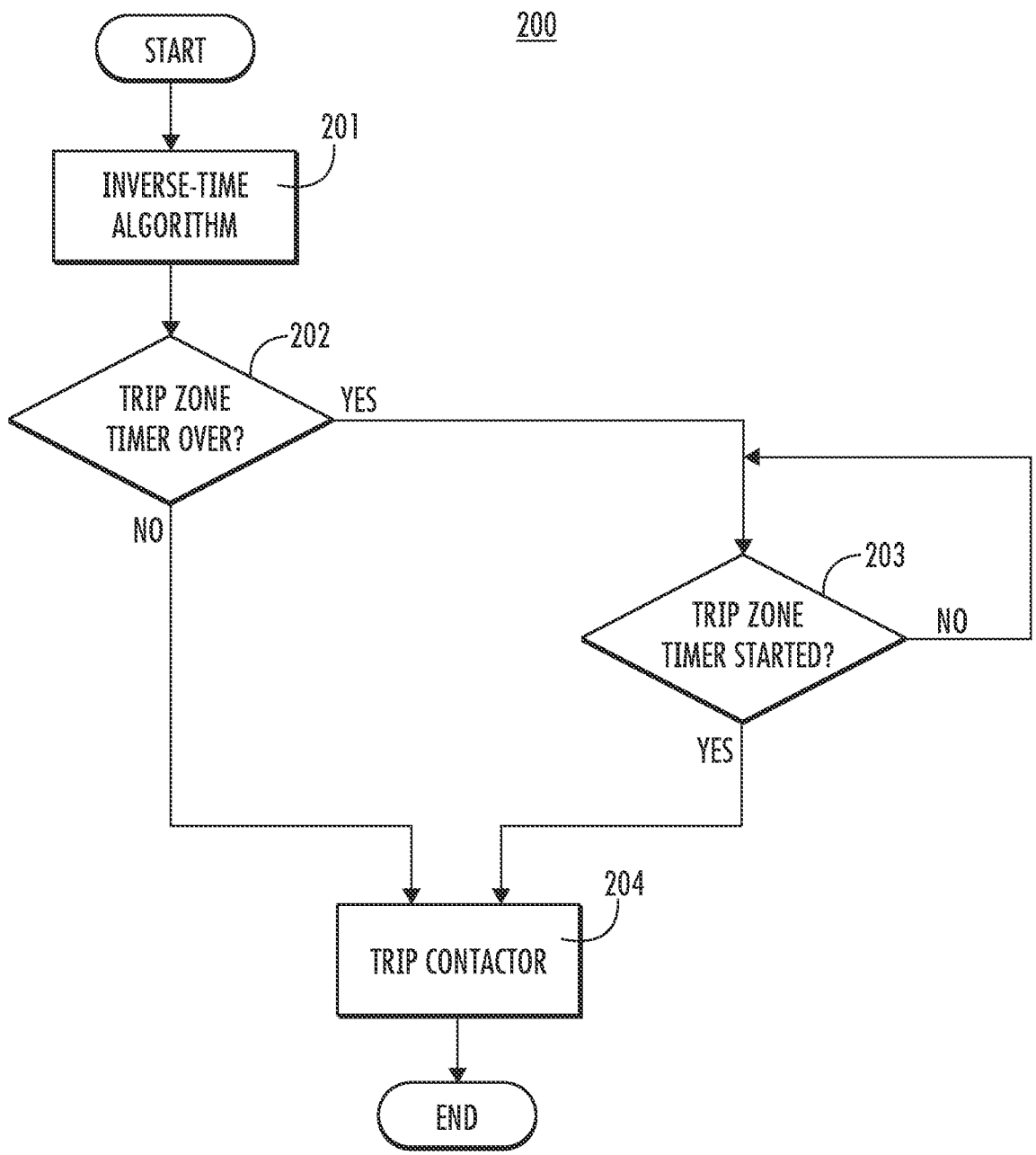
FIG. 3A and FIG. 3B are charts illustrating the trip zone for the AC contactor in accordance with embodiments of the present disclosure.

Optimization of the average opening time for the contactors 134 is further demonstrated in the flowchart 200 of FIG. 3A. At block 201, a trip decision algorithm may be carried out by the CC circuit 114 and/or the microprocessor 133. In some embodiments, the trip decision algorithm may ensure that the contactor trip time is less than an inverse time curve defined for GFCI devices in the UL943(C) standard, wherein devices must not exceed 20 ms for high ground-fault currents. The microprocessor 133 and the CC circuit 114 may implement the inverse-time algorithm based on a determined magnitude of the primary current on the conductor lines 102, 103, 104. If the determined magnitude exceeds a predefined limit, the CC circuit 114 and the microprocessor 133 may output a voltage signal to cause the contactors 134 to open.

At block 202, it is then determined whether the trip zone has started. In some embodiments, the internal trip zone timer 133B of the ZXD module 119 determines whether the optimum trip interval (trip zone) is over. If no, then the AC contactor 112 is tripped at block 204. If yes, it is then determined at block 203 whether the optimum trip interval (trip zone) is started. If yes, then the AC contactor 112 is tripped at block 204. If no, then the decision loops back to block 203.

Figure 3B:
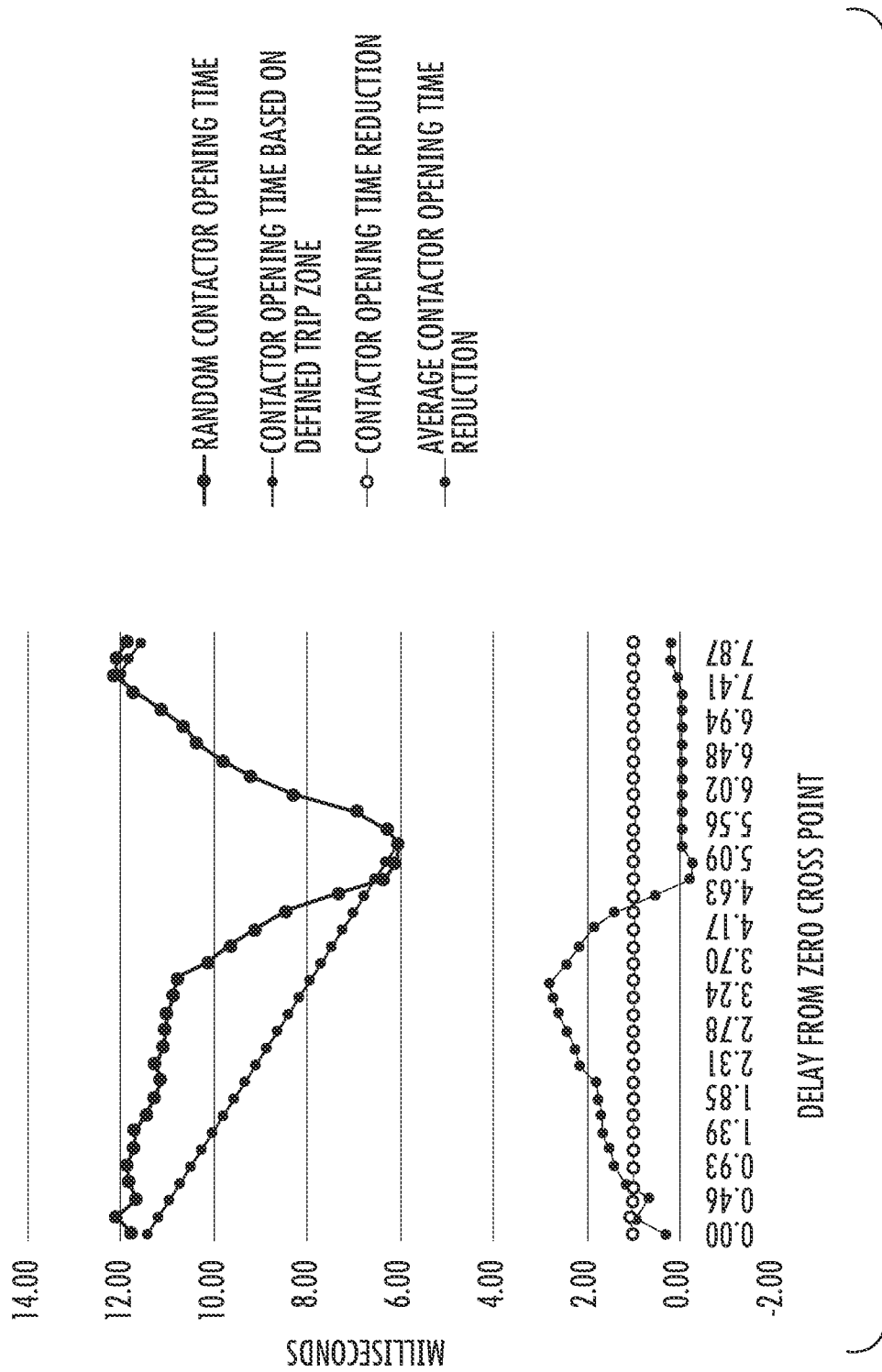

The microprocessor 133, assuming known contactor opening time at each 5-degree phase increment of a sine wave voltage of the coil 137 of the AC contactor 112, power at the VAC line 135, may evaluate the time delays and perform trend analysis to determine that, in some cases, the average contact opening time may be decreased if the disconnection of the contactor 134 control power is delayed. FIG. 3A-3B and Table 1 below demonstrates the effect of opening delay on actual average contactor opening time. The results demonstrate that by delaying the disconnect, and only tripping the contactor 134 in a defined trip zone, the average contactor opening time can be reduced by 1 ms, for example. The shaded cells represent the optimal trip zone. In this case, the start of the trip zone may be 5.32 ms from the 24 VAC line voltage zero-crossing point, and the duration of the trip zone is 2.09 ms in the 60 Hz network. It is noted that Table 1 shows only the first half cycle as the contactor 134 behaves the same for each half cycle.

TABLE 1

| Delay from ZC (ns) | Contactor Opening time | Time to wait | Contactor Opening time based on the defined Trip Zone | Contactor Opening Time reduction |
|---|---|---|---|---|
| 0.00 | 11.75 | 5.32 | 11.42 | 0.33 |
| 0.23 | 12.10 | 5.09 | 11.19 | 0.91 |
| 0.46 | 11.65 | 4.86 | 10.96 | 0.69 |
| 0.69 | 11.85 | 4.63 | 10.73 | 1.12 |
| 0.93 | 11.90 | 4.40 | 10.50 | 1.40 |
| 1.16 | 11.75 | 4.17 | 10.27 | 1.48 |
| 1.39 | 11.70 | 3.94 | 10.04 | 1.66 |
| 1.62 | 11.45 | 3.70 | 9.80 | 1.65 |
| 1.85 | 11.30 | 3.47 | 9.57 | 1.73 |
| 2.08 | 11.15 | 3.24 | 9.34 | 1.81 |
| 2.31 | 11.30 | 3.01 | 9.11 | 2.19 |
| 2.55 | 11.10 | 2.78 | 8.88 | 2.22 |
| 2.78 | 11.10 | 2.55 | 8.65 | 2.45 |
| 3.01 | 11.05 | 2.31 | 8.41 | 2.64 |
| 3.24 | 10.90 | 2.08 | 8.18 | 2.72 |
| 3.47 | 10.80 | 1.85 | 7.95 | 2.85 |
| 3.70 | 10.20 | 1.62 | 7.72 | 2.48 |
| 3.94 | 9.70 | 1.39 | 7.49 | 2.21 |
| 4.17 | 9.15 | 1.16 | 7.26 | 1.89 |
| 4.40 | 8.50 | 0.93 | 7.03 | 1.47 |
| 4.63 | 7.35 | 0.69 | 6.79 | 0.56 |
| 4.86 | 6.40 | 0.46 | 6.56 | −0.16 |
| 5.09 | 6.15 | 0.23 | 6.33 | −0.18 |
| 5.32 | 6.10 | 0.00 | 6.10 | 0.00 |
| 5.56 | 6.35 | 0.00 | 6.35 | 0.00 |
| 5.79 | 7.00 | 0.00 | 7.00 | 0.00 |
| 6.02 | 8.35 | 0.00 | 8.35 | 0.00 |
| 6.25 | 9.25 | 0.00 | 9.25 | 0.00 |
| 6.48 | 9.85 | 0.00 | 9.85 | 0.00 |
| 6.71 | 10.45 | 0.00 | 10.45 | 0.00 |
| 6.94 | 10.70 | 0.00 | 10.70 | 0.00 |
| 7.18 | 11.20 | 0.00 | 11.20 | 0.00 |
| 7.41 | 11.80 | 0.00 | 11.80 | 0.00 |
| 7.64 | 12.20 | 6.02 | 12.12 | 0.08 |
| 7.87 | 12.15 | 5.79 | 11.89 | 0.26 |
| 8.10 | 11.95 | 5.56 | 11.66 | 0.29 |
| Average | 10.21 | | 9.19 | 1.02 |

Returning again to FIG. 1, in some embodiments, the CT 110 may provide a current proportional to magnitude of an electrical current not flowing to the load 106. More specifically, the CT 110 may be configured to generate a secondary current, which is proportional to the vector sum of primary currents flowing through the conductor lines 102, 103, 104. It is to be appreciated that a variety of different types of current transformers may be implemented as the CT 110. With some examples, the CT 110 may be a 600:1 current transformer.

The CTCC circuit 127 may include input terminals electrically connected to the output of the CT 110 and an output terminal electrically connected to the microprocessor 133. Although not shown, the CTCC circuit 127 may also include a termination resistor, an amplifier, and a filter. The termination resistor may cause the CTCC circuit 127 to convert the output of the CT 110 into a voltage signal. The voltage signal may be amplified by the amplifier and then filtered by the filter. In some non-limiting examples, the filter may be a 360 Hz low-pass anti-aliasing filter. The signal may then be received by the analog to digital (A/D) input of the microprocessor 133.

As further shown in FIG. 1, the device 100 may include the GFT circuit 126 to satisfy the requirements of UL 943(C). Although not shown, the GFT circuit 126 may include a PWM voltage to current converter. In some embodiments, generation of the PWM signal is performed by the microprocessor 133. In general, the ground fault test activation switch may be any device that may be actuated by a user to initiate a ground-fault test by the device 100. In some examples, the switch may be implemented in the interface circuit 130, described in greater detail below.

During operation, when the switch is actuated, the microprocessor 133 may generate a predefined pulse-width modulated (PWM) voltage signal. In some examples, the microprocessor 133 may implement a PWM sine-wave algorithm to generate the PWM voltage signal comprising a 60 Hz test signal and a carrier signal. The level of 60 Hz test signal is greater than the trip threshold specified in the UL 943(C) standard. The PWM voltage signal is converted into a PWM current signal by the signal converter and passed through the window of the CT 110. More specifically, the PWM current signal output by the signal converter is sent to the CT 110. As the magnitude of the 60 Hz test current is above the trip threshold of the device 100, a ground-fault will be detected and the contactors 134 will be opened. As such, the device 100 includes functionality to determine if it is operating properly.

The LGC circuit 131 may connect to the termination device 132 located at the load 106 and a microprocessor. In general, the LGC circuit 131, using a DC continuity circuit, may be configured to verify that the termination device 132 is connected to ground at the load 106. More specifically, the load 106 may be grounded through the ground connection between the device 100 and the load 106.

The interface circuit 130 of the device 100 may include trip indicators (not shown). In some examples, the trip indicators may be light emitting diodes (LEDs) or similar indicating means, located on the exterior of a housing of the device 100. The indicators may provide observers (e.g., a user or operator) with an indication of the device's operational state. The interface circuit 130 may further include a ground-fault test button and a reset button also located on the exterior of the housing. In some examples, the button may be operatively connected to the activation switch in order to initiate a ground-fault test as described above. As such, by pressing the test button, a human operator may manually actuate the switch and initiate a ground-fault trip test in the manner described above. Additionally, the pressing of the reset button may restore the device 100 to normal operation after a ground-fault trip test has been performed.

The DC PS 128 may provide power to the other circuits of the device 100. In some embodiments, the DC PS 128 may include diodes and a capacitive filter. A step-down transformer 136 may be electrically connected to the conductor lines 102, 104. As such, during operation, the step-down transformer 136 may receive some of the power supplied by the three-phase power supply 101 connected to the input terminals. The step-down transformer 136 may then step-down the voltage to a level desired to power the components of the device 100. The DC PS 128 may rectify the power signal prior to being supplied to the other components of the device 100. As such, the DC PS 128 may provide a constant, regulated power signal to the components of the device 100.

It will be appreciated that a variety of the circuits described herein may be implemented using a microprocessor, or other computing device configured to execute computer executable instructions or perform computing functions. With some examples, the microprocessor 133 may be implemented to perform the functionality of all the microprocessors described herein. With other examples, individual microprocessors may be implemented to perform the functionality of one or more of the circuits described herein. Examples are not limited in this context.

In some embodiments, a half-wave discrete Fourier transform (DFT) filter 142 implemented in the microprocessor 133 may be used to meet trip time requirements of UL943 while attenuating fault current harmonics. More specifically, the DFT filter 142 can be used to address switching of line currents by variable frequency drives (VFD) or solid-state starters, which causes harmonic voltages that drive harmonic capacitive current from the phases to ground. In a three-phase system, such as the device 100, triplen harmonics are in-phase and their sum is three times the individual magnitude. For example, in a 60 Hz network, 180 Hz, 540 Hz, 900 Hz system, etc., components add to the 60 Hz fundamental component. This can result in nuisance ground fault trips. Triplen harmonics may require undesirably high ground fault trip levels to avoid nuisance tripping.

Figure 4:
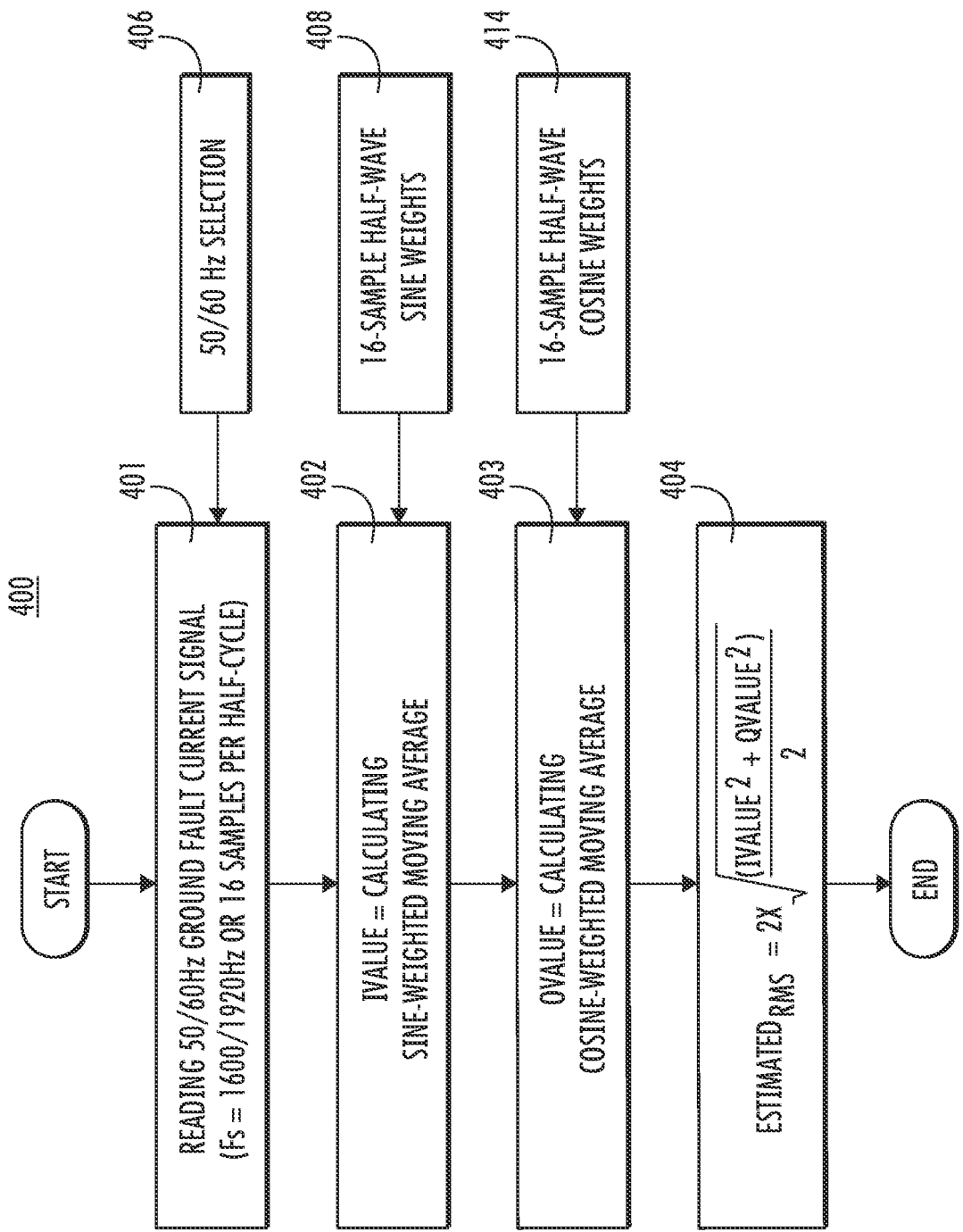
FIG. 4 is a flowchart illustrating a half-wave DFT filter used to attenuate harmonics in accordance with embodiments of the present disclosure.
Figure 5:
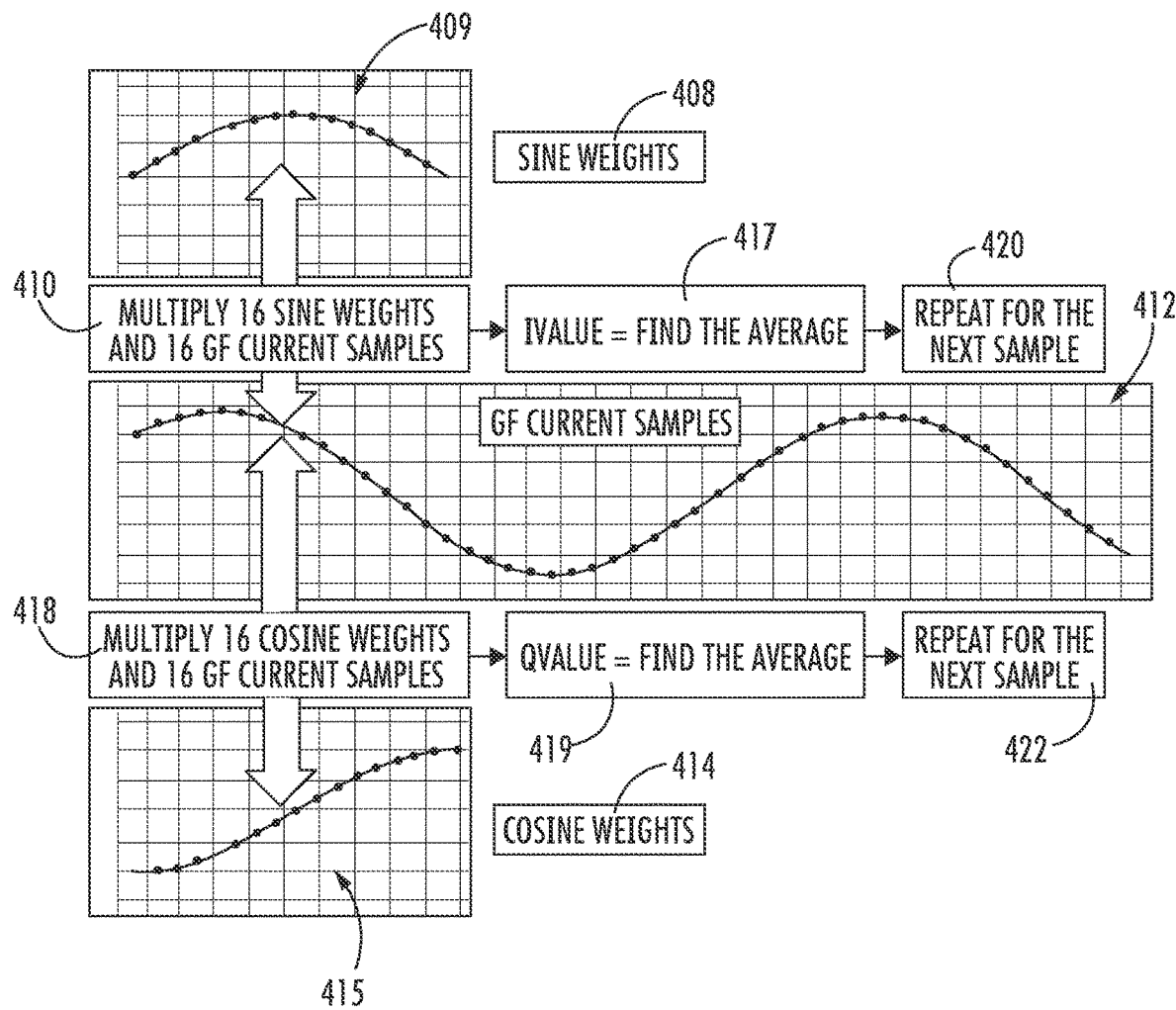
FIG. 5 includes a plurality of graphs illustrating use of the half-wave DFT filter in accordance with embodiments of the present disclosure.
Figure 6A:
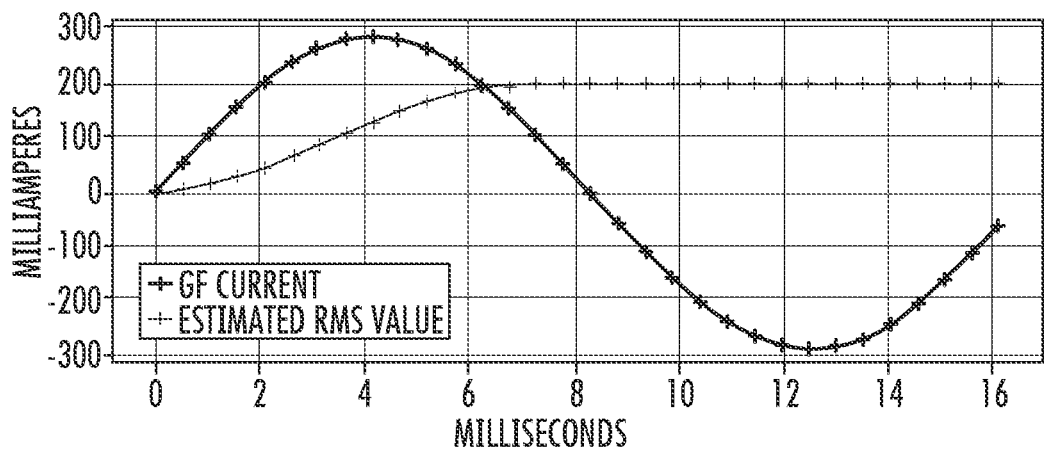
FIGS. 6A-6D demonstrate various half-wave DFT filter outputs for GF waveforms with different initial phases in accordance with embodiments of the present disclosure.
Figure 6B:
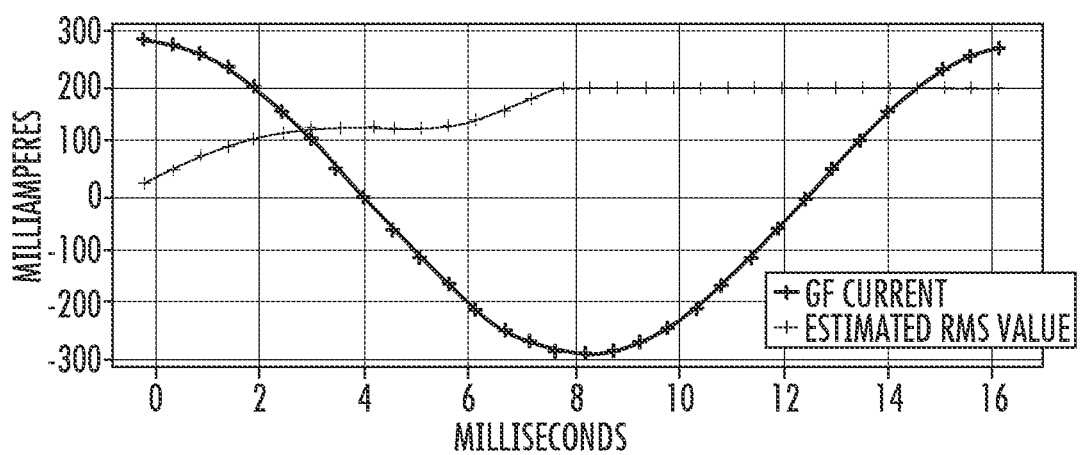
Figure 6C:
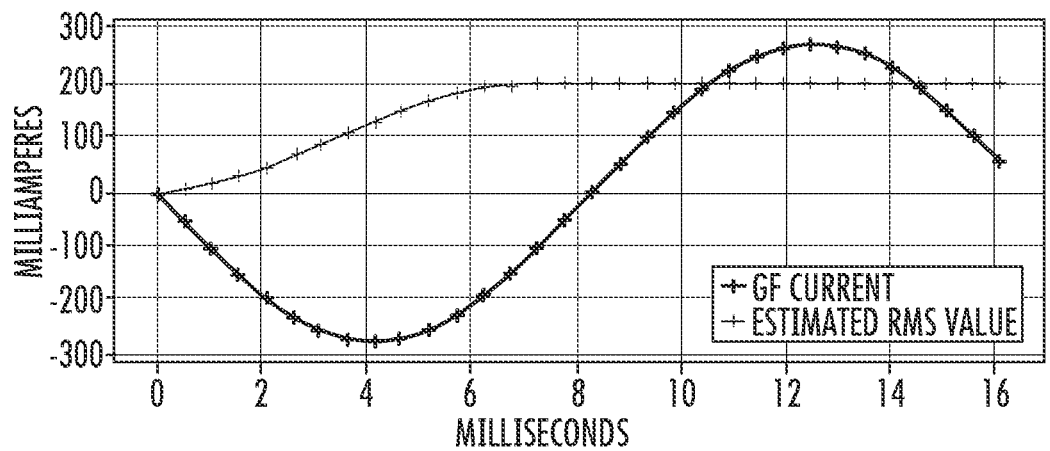
Figure 6D:
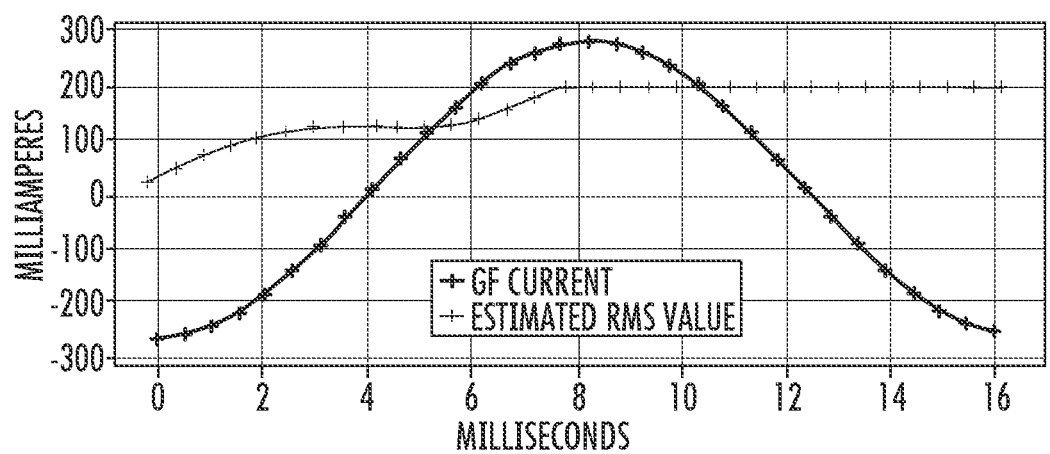

FIGS. 4-5 demonstrate a half-wave DFT filter 400 operable to attenuate the odd harmonics and mitigate undesired affects. The DFT filter 400 may be the same as DFT filter 142 shown in FIG. 1. In some embodiments, the DFT filter 400 may read a 50/60 Hz ground fault current signal, as shown at block 401. In other embodiments, a different ground fault current signal may be selected. At block 402, the DFT filter 400 may calculate current ($I_{value}$), e.g., by calculating a sine-weighted moving average. In some embodiments, the sine-weighted moving average may be determined by multiplying the sine weights 409 with a corresponding 16-sample size of GF currents 412, as shown at block 410, and finding the average, as shown in block 417. $I_{value}$ may again be calculated for the next sample, as shown at block 420.

At block 403, the $Q_{value}$ may be determined by calculating a cosine-weighted moving average, wherein the cosine-weighted moving average may be determined by multiplying the cosine weights 415 with the corresponding 16-sample size of GF currents 412, as shown at block 418, and finding the average, as shown in block 419. $Q_{value}$ may again be calculated for the next sample, as shown at block 422 (FIG. 5). Finally, at block 404, an estimated root mean square (RMS) may be calculated based on the $I_{value}$ and the $Q_{value}$.

Figure 7A:
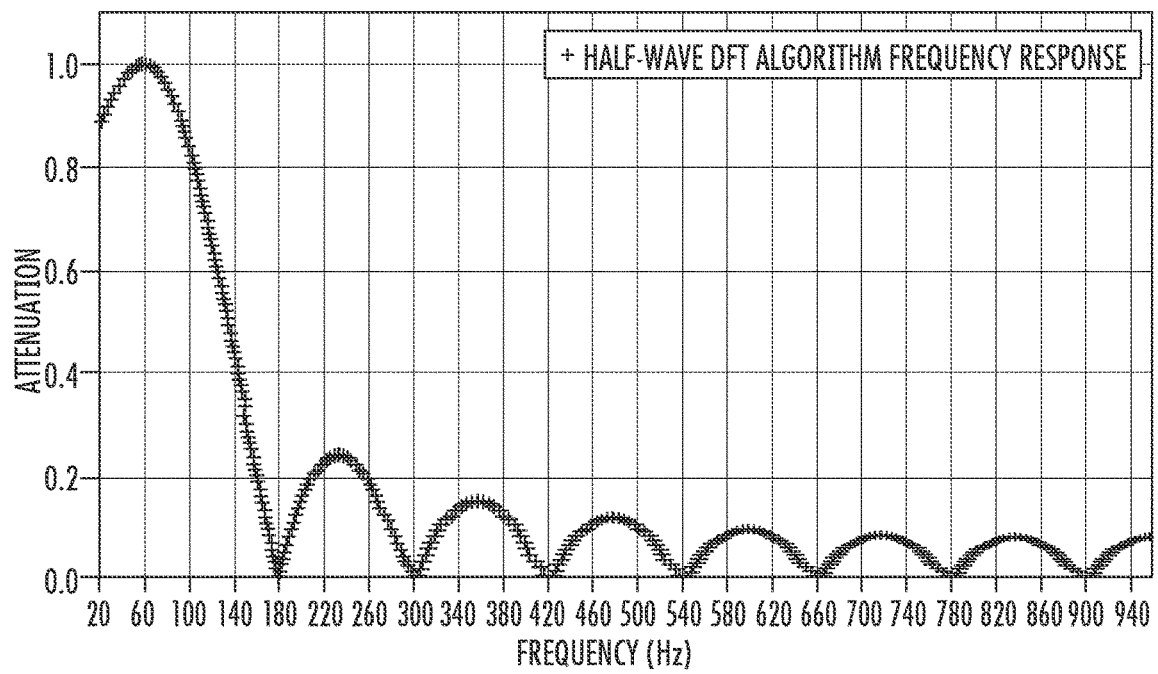
FIGS. 7A-7B are graphs illustrating various half-wave DFT filter frequency responses in accordance with embodiments of the present disclosure.
Figure 7B:
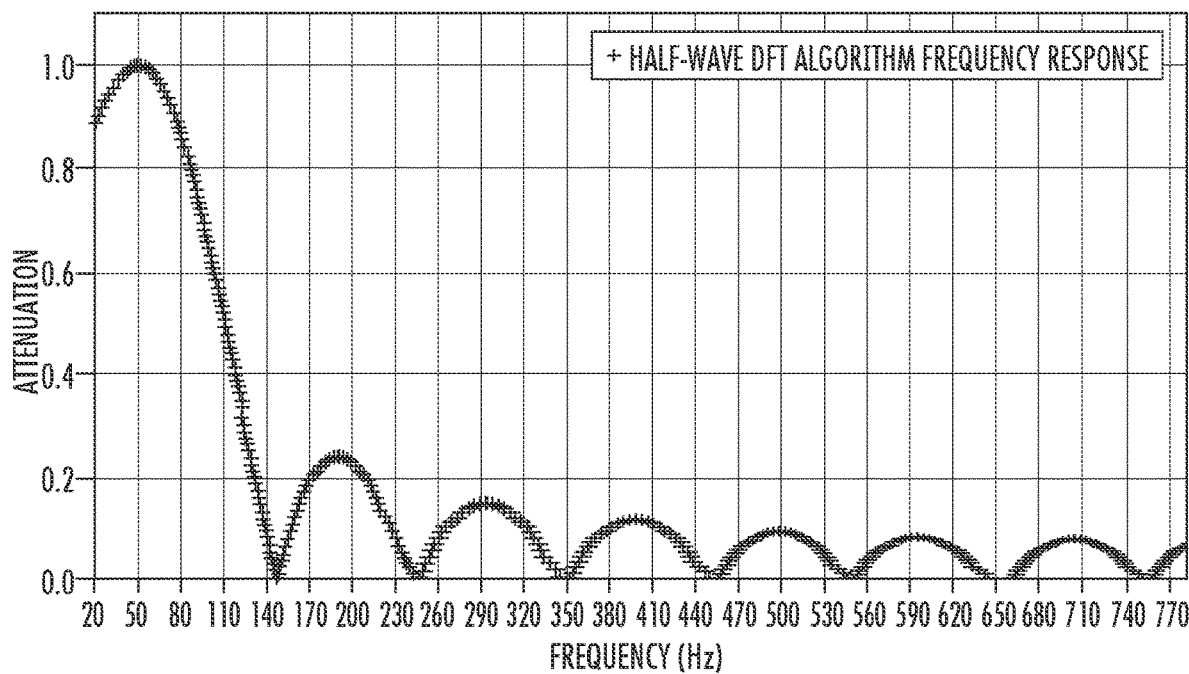

FIGS. 6A-6D demonstrate half-wave DFT filter outputs for 60 Hz GF waveforms with different initial phases. In these non-limiting embodiment, the GF current sampling rate is 32 samples per cycle. In the present example, the half-wave DFT settling time may be 8.33 ms in a 60 Hz network regardless of initial phases. Embodiments herein are not limited in this context. FIG. 7A demonstrates a 60 Hz Half-wave DFT filter frequency response, while FIG. 7B demonstrates a 50 Hz Half-wave DFT filter frequency response.

Figure 8:
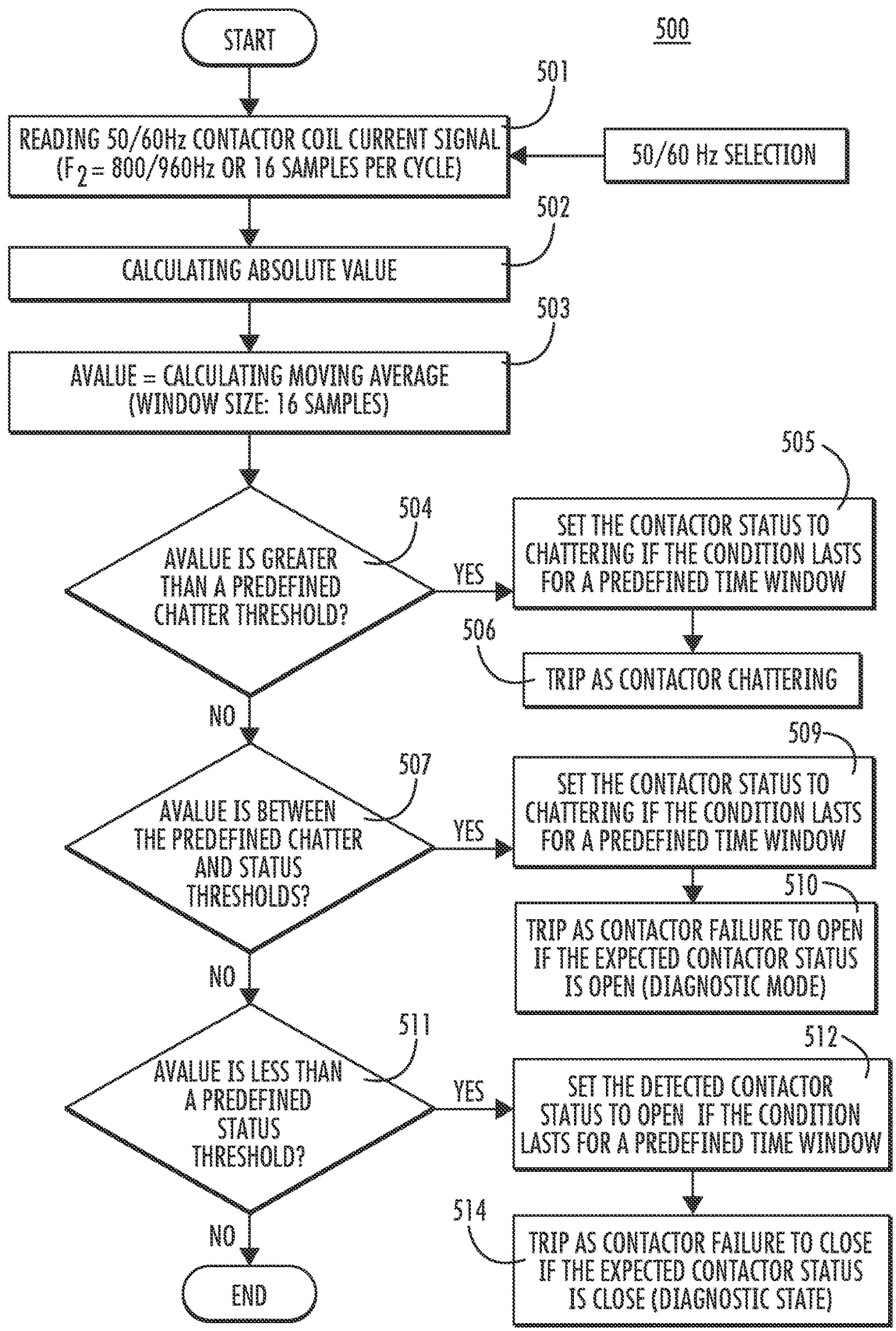
FIG. 8 is a flowchart illustrating contactor status and chatter detection in accordance with embodiments of the present disclosure.

Turning now to FIG. 8, an approach 500 for detecting contactor status and chatter without using a contactor auxiliary contact is shown. In some embodiments, the CCCM circuit 125 (FIG. 1) may be used to monitor current of the coil 137. The contactor status and chatter are estimated from the contactor coil current. As shown at block 501, the contactor coil current is measured by the contactor coil current monitoring circuit 125 and the microprocessor 133 to detect the status of the contactor. In this embodiment, the coil current may be sampled at 16 samples per cycle rate. At block 502, the absolute values of the coil current ADC sample are fed to a moving average with a window length of 16 samples, and at block 503 the average value ($A_{value}$) is calculated. In some embodiments, the $A_{value}$ is then compared with one or more thresholds, such as a predefined chatter threshold and a predefined status threshold. As shown at block 504, the $A_{value}$ is compared to the chatter threshold. If the average value is greater than the chatter threshold, the contactor is in chattering state. If this chattering state lasts longer than a predefined time period (e.g., 500 ms), the detected contactor status is set to 'chattering' at block 505, and the unit will trip and indicate a contactor chatter error code at block 506.

If the average value back at block 504 is less than the predefined chatter threshold, then it is determined, at block 507, whether the average value is between the predefined chatter threshold and the status threshold. If yes, then at block 509 the detected contactor status is set to 'close' if the condition lasts longer than a predefined time period (e.g., 500 ms). The contactor is then tripped and unit will indicate a contactor status error code at block 510 if the expected contactor status is open.

If at block 507 the average value is not between the predefined chatter threshold and the status threshold, then it is determined, at block 511, if the average value is less than a predefined status threshold. If yes, the contactor is set to an 'open' state (block 512) if the condition lasts longer than a predefined time period (e.g., 500 ms), and the contactor is then tripped and unit will indicate a contactor status error code at block 514 in the case the expected contactor status is close.

Figure 9:
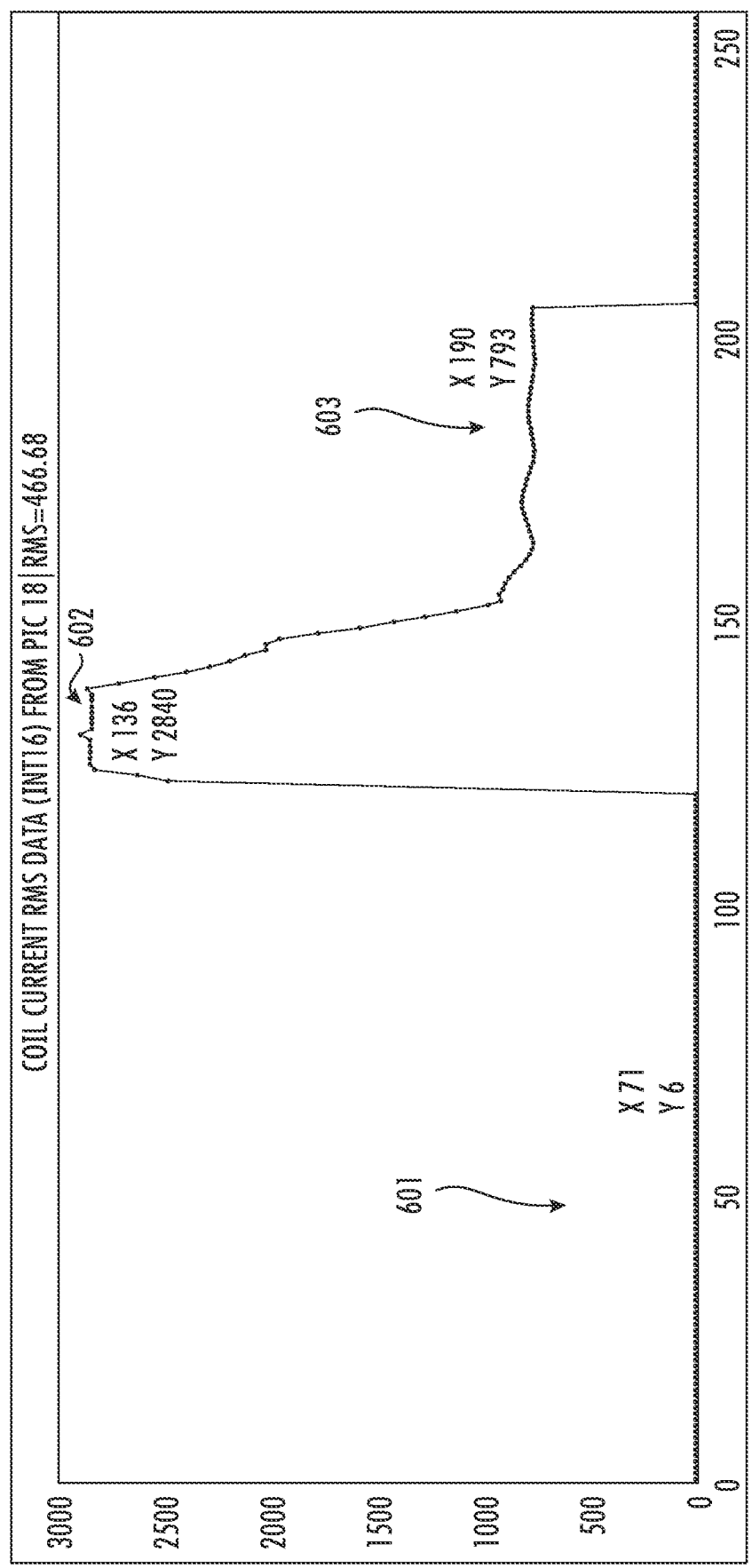
FIG. 9 is a graph illustrating different currents for different states of the contactor in accordance with embodiments of the present disclosure.

FIG. 9 demonstrates different currents for different states of the contactor. A first interval 601 in which the average value may be around the 6 LSB, corresponds to the no current part of the contactor. A second interval 602 in which the average value may be around the 2800 LSB, corresponds to the chattering current part, while a third interval 603 in which the average value may be around the 800 LSB, corresponds to the closed current part.

Figure 10:
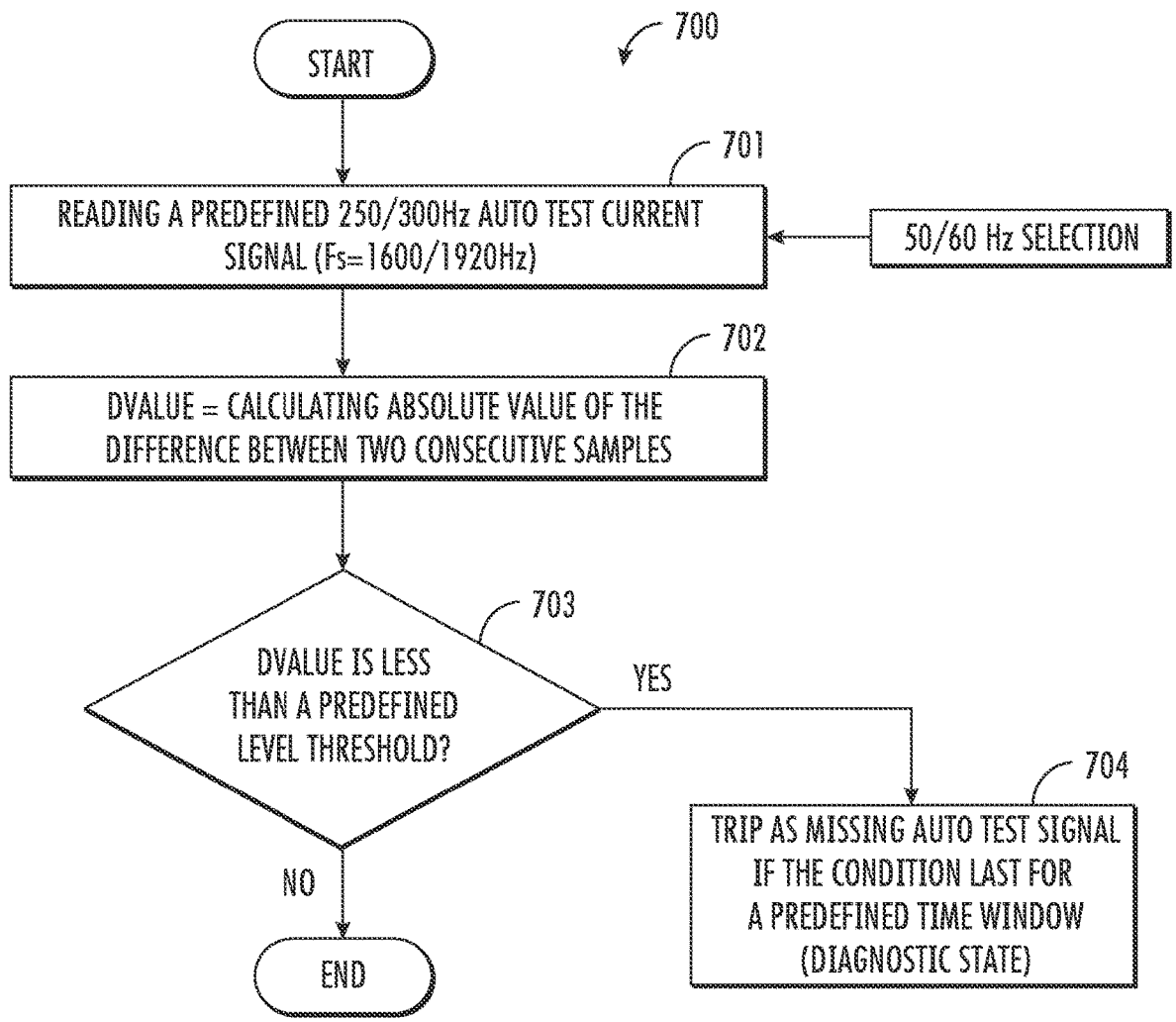
FIG. 10 is a flowchart illustrating an approach for continuous auto-monitoring in accordance with embodiments of the present disclosure.

FIG. 10 demonstrates a continuous non-destructive auto-monitoring function 700 according to embodiments of the present disclosure. In some embodiments, the device 100 may be provided with an auto-monitoring function, which allows for automatic testing of the ability of the device 100 to respond to a ground fault. Advantageously, the testing may be done without opening the AC contactor 112. Furthermore, the auto-monitoring function does not compromise the ability of the device 100 to respond to a ground fault. Although non-limiting, in some embodiments, a continuous 1 mA, 300 Hz fault current may be generated to check the health of the CT 110 and the CTCC circuit 127.

The DFT filter 400 may attenuate this signal to a level that can be ignored even in a GFCI with a ground-fault trip level of 6 mA, for example.

At block 701, the function 700 may include reading a predefined 250/300 Hz auto test current signal (FS=1600/1920 Hz). $D_{value}$ may then be determined by calculating an absolute value of a difference between two consecutive samples, as shown at block 702. If $D_{value}$ is determined at block 703 to be less than a predefined level threshold, then a trip is issued at block 704 in the case the condition lasts longer than a predefined time period (e.g., 500 ms).

Figure 11:
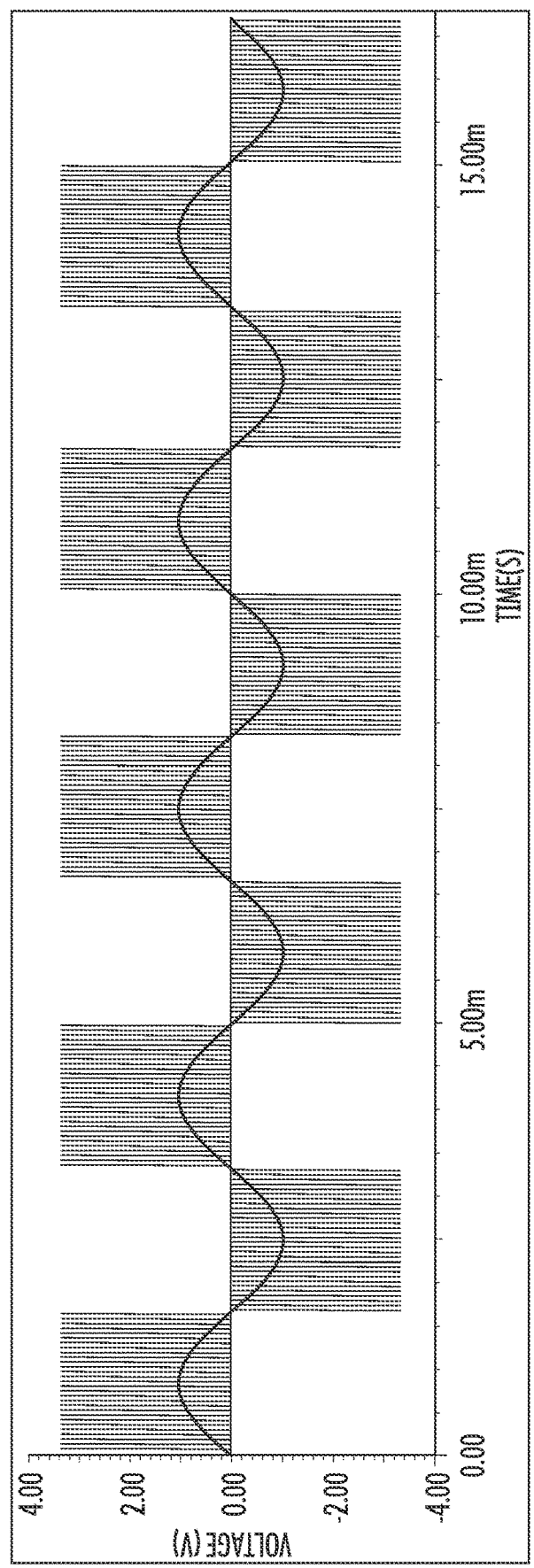
FIG. 11 is a graph demonstrating an auto test signal injected through a current transformer to monitor circuit health in accordance with embodiments of the present disclosure.

FIG. 11 demonstrates an auto test signal 800 that may be continuously injected through the CT 110 (FIG. 1) to monitor the GF measurement circuit health. In this embodiment, the auto test signal 800 may be a PWM signal with a carrier frequency of 17316 Hz consisting of a sinusoidal auto test signal with amplitude of 1 mA, a frequency of 300 Hz, which is continuously injected through the CT 110. The CT 110 and a low-pass anti-aliasing filter may smooth out the PWM signal 800 to a sinusoidal auto test signal. If the firmware does not detect the auto test signal, it trips the AC contactor 112 and indicates a diagnostic error. In some embodiments, the frequency of the PWM auto test signal 800 is selected in a way that the DFT algorithm rejects it in the normal operation, 300 Hz in a 60 Hz network, for example. The auto test signal may be disabled, e.g., for 2.5 seconds after the AC contactor 112 closes and during the time that the GF test signal is activated.

Embodiments of the present disclosure may use the absolute value of the difference between the two most recent GF ADC samples to detect the auto test signal. The firmware of the microprocessor 133 may trip the AC contactor 112 and indicate a diagnostic error if the GF ADC input is stuck at 0V or 3.3V, for example. If the absolute value of the difference value is less than the threshold value (e.g., 5 LSB), then an auto test signal missing timer starts to count. If this timer reaches a threshold (e.g., 500 ms), a trip will be triggered and a diagnostic error indicated. However, if the difference value is greater than the threshold value, the timer will be reset.

Figure 12:
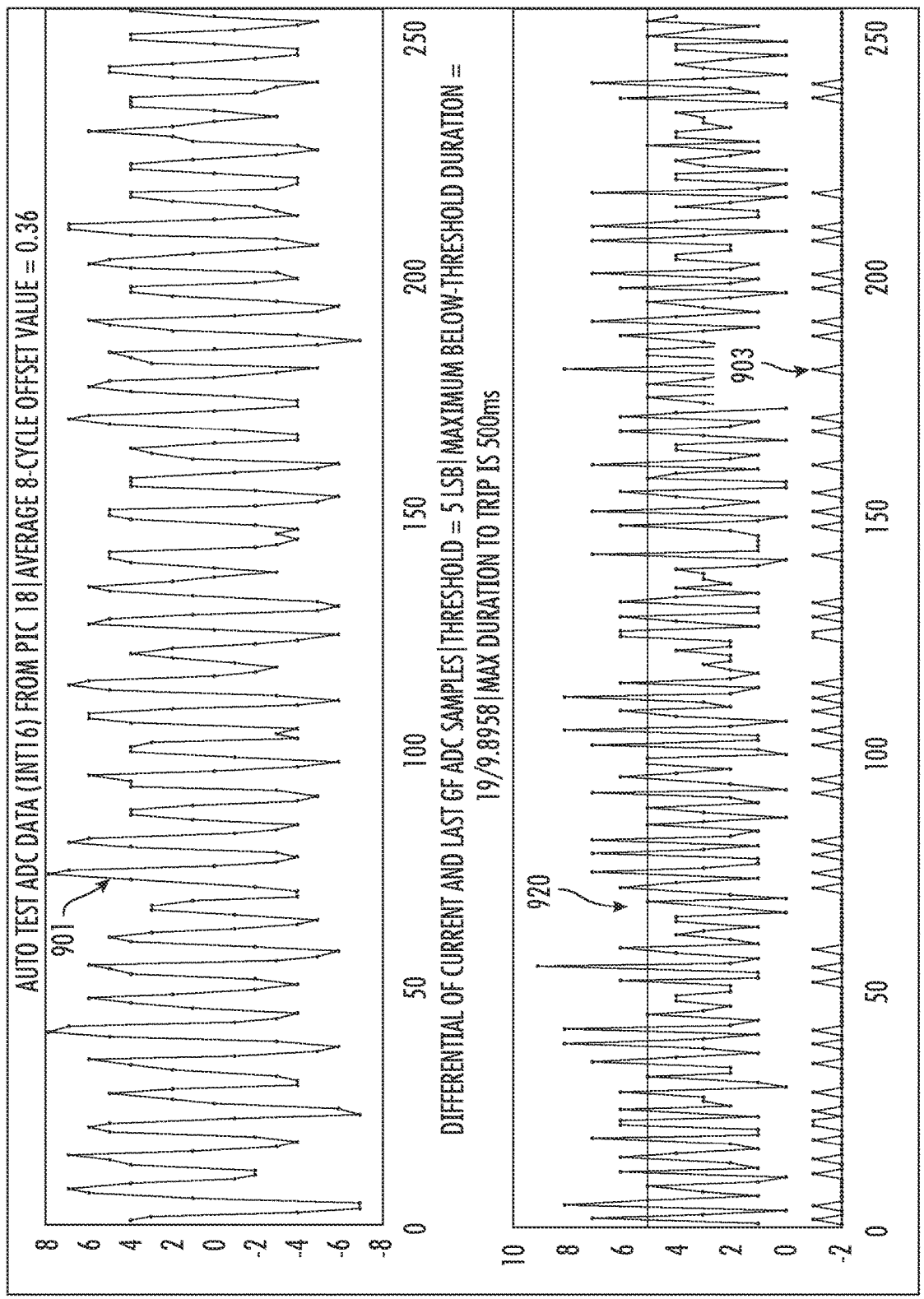
FIG. 12 is a graph of GF ADC samples with injection of an auto test signal in accordance with embodiments of the present disclosure.
Figure 13:
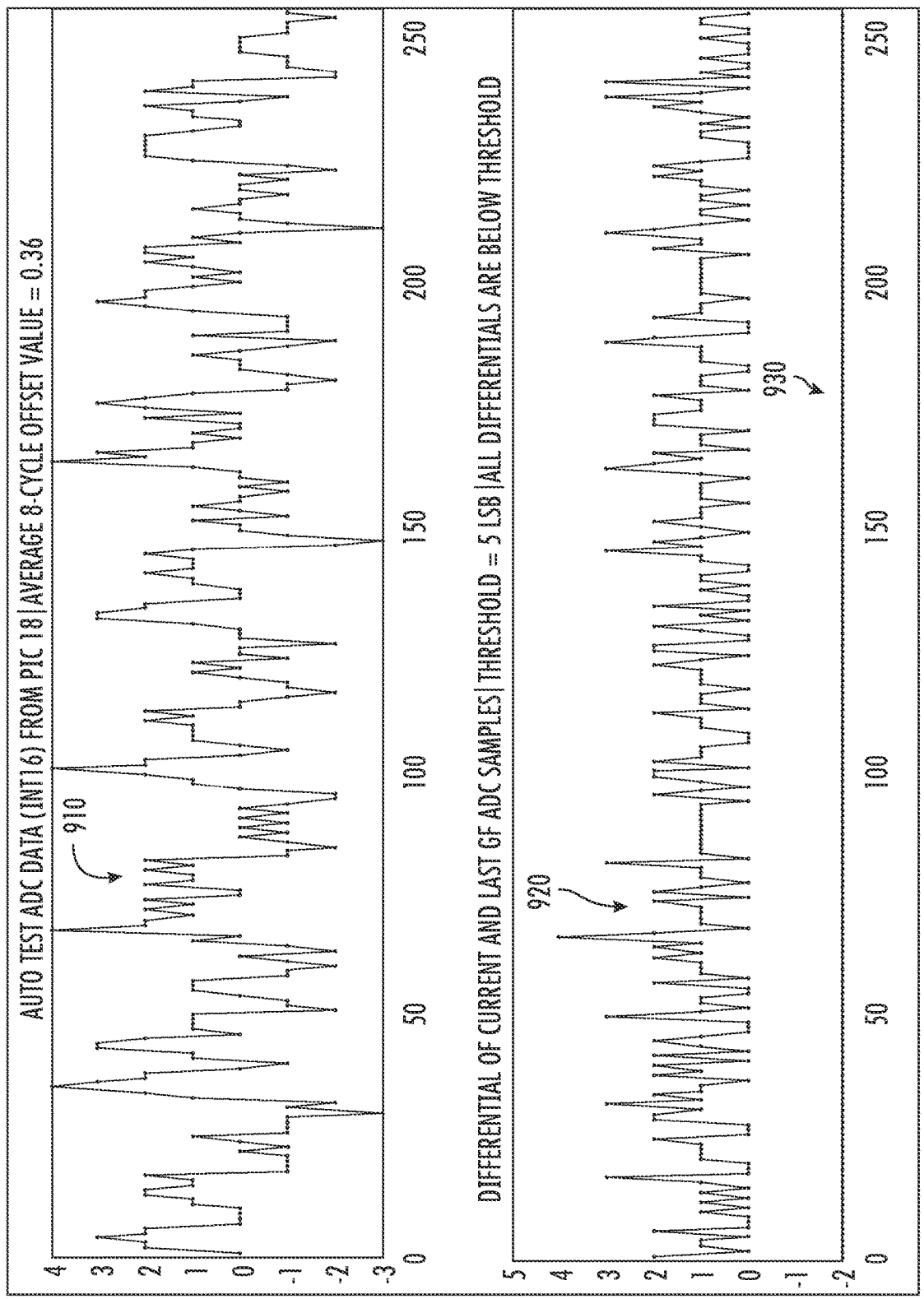
FIG. 13 is a graph of GF ADC samples without injection of an auto test signal in accordance with embodiments of the present disclosure.

FIGS. 12-13 show examples of the GF ADC samples with and without injection of the auto test signal. In FIG. 12, an auto test signal is injected, wherein a first signal 901 is GF ADC samples, a second signal 902 is the absolute value of the GF ADC samples difference, and a third signal 903 is the binary state representation of the difference signal 902, wherein (−1) is greater than the threshold and (−2) is smaller than the threshold. In FIG. 13, no auto test signal is injected. The first signal 910 is GF ADC samples, the second signal 920 is the absolute value of the GF ADC samples difference, and the third signal 903 is the binary state representation of the difference signal 902, wherein (−1) is greater than the threshold, (−2) is smaller than the threshold.

The foregoing discussion has been presented for purposes of illustration and description and is not intended to limit the disclosure to the form or forms disclosed herein. For example, various features of the disclosure may be grouped together in one or more aspects, embodiments, or configurations for the purpose of streamlining the disclosure. However, it should be understood that various features of the certain aspects, embodiments, or configurations of the disclosure may be combined in alternate aspects, embodiments, or configurations. Moreover, the following claims are hereby incorporated into this Detailed Description by this reference, with each claim standing on its own as a separate embodiment of the present disclosure.

As used herein, an element or step recited in the singular and proceeded with the word "a" or "an" should be understood as not excluding plural elements or steps, unless such exclusion is explicitly recited. Furthermore, references to "one embodiment" of the present disclosure are not intended to be interpreted as excluding the existence of additional embodiments that also incorporate the recited features.

The use of "including," "comprising," or "having" and variations thereof herein is meant to encompass the items listed thereafter and equivalents thereof as well as additional items. Accordingly, the terms "including," "comprising," or "having" and variations thereof are open-ended expressions and can be used interchangeably herein.

The phrases "at least one", "one or more", and "and/or", as used herein, are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

All directional references (e.g., proximal, distal, upper, lower, upward, downward, left, right, lateral, longitudinal, front, back, top, bottom, above, below, vertical, horizontal, radial, axial, clockwise, and counterclockwise) are only used for identification purposes to aid the reader's understanding of the present disclosure, and do not create limitations, particularly as to the position, orientation, or use of this disclosure. Connection references (e.g., attached, coupled, connected, and joined) are to be construed broadly and may include intermediate members between a collection of elements and relative movement between elements unless otherwise indicated. As such, connection references do not necessarily infer that two elements are directly connected and in fixed relation to each other.

Furthermore, identification references (e.g., primary, secondary, first, second, third, fourth, etc.) are not intended to connote importance or priority, but are used to distinguish one feature from another. The drawings are for purposes of illustration only and the dimensions, positions, order and relative sizes reflected in the drawings attached hereto may vary.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A device comprising:
a plurality of conductor lines connected between a power supply and a load, each of the plurality of conductor lines coupled to an alternating current (AC) contactor and a contactor control circuit, wherein the contactor control circuit is operable to open and close one or more contactors of the AC contactor;
a current transformer coupled to the plurality of conductor lines, wherein the current transformer is operable to output a secondary current corresponding to a primary current magnitude of an electrical current not flowing to the load, and wherein the AC contactor is connected between the power supply and the load; and
a zero cross detection circuit operable to:
generate an interrupt at each of a plurality of zero crossings for a microprocessor; and
determine whether to open the one or more contactors of the AC contactor in a predetermined optimum interval calculated with respect to the plurality of zero crossing points;
wherein the zero cross detection circuit and the microprocessor are operable to determine whether a time lapse between two consecutive interrupts exceeds a predetermined threshold and to send a trip signal to the contactor control circuit to open the one or more contactors of the AC contactor.

2. The device of claim 1, further comprising a CT current condition circuit, wherein the CT current condition circuit and the microprocessor are operable to determine whether a magnitude of the secondary current exceeds a predetermined value and to send a trip signal based on the determination that the magnitude of the secondary current exceeds the predetermined value.

3. The device of claim 2, further comprising a ground fault test circuit, wherein the ground fault test circuit and the microprocessor are operable to monitor a health of the current transformer and the CT current condition circuit by continuously injecting a pulse-width modulated (PWM) signal comprising an auto test signal and a carrier signal through the current transformer.

4. The device of claim 1, wherein the contactor control circuit and the microprocessor are operable to delay disconnection of power to the plurality of conductor lines for a predetermined period of time to decrease an average time to open the one or more contactors of the AC contactor.

5. The device of claim 4, wherein the microprocessor is operable to minimize an average of contactor opening time by examining the time lapse between two consecutive interrupts, and determining a time delay to open the one or more contactors of the AC contactor based on the time lapse between the two consecutive interrupts.

6. The device of claim 1, wherein a contactor coil current monitoring circuit and the microprocessor are operable to:
monitor a current of a coil of the AC contactor; and
determine a status of the AC contactor and a chatter amount of the AC contactor based on the current of the coil.

7. The device of claim 1, further comprising a half-wave discrete Fourier transform (DFT) filter.

8. The device of claim 7, wherein the half-wave DFT filter is operable to filter an auto test signal, and wherein the microprocessor is operable to detect whether the auto test signal is valid by determining an absolute value of a difference between a pair of ground-fault analog-to-digital converter samples.

9. A device comprising:
a ground fault circuit interrupter connected between a power supply and a load, the ground fault circuit interrupter including an alternating current (AC) contactor and a current transformer each connected to a plurality of conductor lines, wherein the plurality of conductor lines are connected to the power supply and the load; and
a control circuit of the ground fault circuit, the control circuit comprising:
a current transformer coupled to the plurality of conductor lines, wherein the current transformer is operable to output a secondary current corresponding to a primary current magnitude of an electrical current not flowing to the load, and wherein the AC contactor is connected between the power supply and the load; and
a zero cross detection circuit operable to:
generate an interrupt at each of a plurality of zero crossings for a microprocessor; and
determine whether to open one or more contactors of the AC contactor in a predetermined optimum interval calculated with respect to a plurality of zero crossing points;
wherein the zero cross detection circuit and the microprocessor are operable to determine whether a time lapse between two consecutive interrupts exceeds a predetermined threshold and to send a trip signal to the contactor control circuit to open the one or more contactors of the AC contactor.

10. The device of claim 9, further comprising a CT current condition circuit, wherein the CT current condition circuit and the microprocessor are operable to determine whether a magnitude of the secondary current exceeds a predetermined value and to send a trip signal based on the determination that the magnitude of the secondary current exceeds the predetermined value.

11. The device of claim 10, further comprising a ground fault test circuit, wherein the ground fault test circuit and the microprocessor are operable to monitor a health of the current transformer and the CT current condition circuit by continuously injecting a pulse-width modulated (PWM) signal comprising an auto test signal and a carrier signal through the current transformer.

12. The device of claim 9, wherein the contactor control circuit and the microprocessor are operable to delay disconnection of power to the plurality of conductor lines for a predetermined period of time to decrease an average time to open the one or more contactors of the AC contactor.

13. The device of claim 12, wherein the microprocessor is operable to minimize an average of contactor opening time by examining the time lapse between two consecutive interrupts, and determining a time delay to open the one or more contactors of the AC contactor based on the time lapse between the two consecutive interrupts.

14. The device of claim 9, wherein a contactor coil current monitoring circuit and the microprocessor are operable to:
monitor a current of a coil of the AC contactor; and
determine a status of the AC contactor and a chatter amount of the AC contactor based on the current of the coil.

15. The device of claim 9, further comprising a half-wave discrete Fourier transform (DFT) filter.

16. The device of claim 15, wherein the half-wave DFT filter is operable to filter an auto test signal, and wherein the microprocessor is operable to detect whether the auto test signal is valid by determining an absolute value of a difference between a pair of ground-fault analog-to-digital converter samples.

17. A three-phase ground-fault circuit-interrupter (GFCI) device, comprising:

a plurality of conductor lines connected between a power supply and a load, each of the plurality of conductor lines coupled to an alternating current (AC) contactor and a contactor control circuit, wherein the contactor control circuit is operable to open and close one or more contactors of the AC contactor; and a current transformer coupled to the plurality of conductor lines, wherein the current transformer is operable to output a secondary current corresponding to a primary current magnitude of an electrical current not flowing to the load; and a zero cross detection circuit operable to:

generate an interrupt at each of a plurality of zero crossings for a microprocessor; and determine whether to open the one or more contactors of the AC contactor in a predetermined optimum interval calculated with respect to the plurality of zero crossing points;

wherein the zero cross detection circuit and the microprocessor are operable to determine whether a time lapse between two consecutive interrupts exceeds a predetermined threshold and to send a trip signal to the contactor control circuit to open the one or more contactors of the AC contactor.

18. The device of claim 17, further comprising a CT current condition circuit, wherein the CT current condition circuit and the microprocessor are operable to determine whether a magnitude of the secondary current exceeds a predetermined value and to send a trip signal based on the determination that the magnitude of the secondary current exceeds the predetermined value.

\* \* \* \* \*